(12) United States Patent
Dennison et al.

(10) Patent No.: US 7,572,666 B2
(45) Date of Patent: *Aug. 11, 2009

(54) REDUCED AREA INTERSECTION BETWEEN ELECTRODE AND PROGRAMMING ELEMENT

(76) Inventors: Charles H. Dennison, 5719 Algonquin Way, San Jose, CA (US) 95138; Alice T. Wang, 824 Bolton Dr., Milpitas, CA (US) 95035; Kanaiyalal Chaturbhai Patel, 1694 Vinehill Cir., Fremont, CA (US) 94539; Jenn C. Chow, 4006 N. Rincon Ave., Campbell, CA (US) 95008

( * ) Notice: Subject to any disclaimer, the term of this patent is extended or adjusted under 35 U.S.C. 154(b) by 457 days.

This patent is subject to a terminal disclaimer.

(21) Appl. No.: 10/438,146

(22) Filed: May 13, 2003

(65) Prior Publication Data

US 2003/0203555 A1  Oct. 30, 2003

Related U.S. Application Data

(63) Continuation of application No. 09/896,531, filed on Jun. 30, 2001, now Pat. No. 6,605,527.

(51) Int. Cl.
*H01L 21/00* (2006.01)
(52) U.S. Cl. ........... 438/95; 257/2; 257/4; 257/E21.613
(58) Field of Classification Search .................. 438/618, 438/637, 639, 95; 257/2, 4, E21.613, E29.17
See application file for complete search history.

(56) References Cited

U.S. PATENT DOCUMENTS

| | | | |
|---|---|---|---|
| 5,177,567 A * | 1/1993 | Klersy et al. ................ 257/4 |
| 5,296,716 A | 3/1994 | Ovishinsky et al. |
| 5,789,758 A | 8/1998 | Reinberg |
| 5,879,955 A | 3/1999 | Gonzalez et al. |
| 5,920,788 A | 7/1999 | Reinberg |
| 5,933,365 A | 8/1999 | Klersy et al. |
| 5,970,336 A | 10/1999 | Wolstenholme et al. |
| 5,998,244 A | 12/1999 | Wolstenholme et al. |
| 6,002,140 A | 12/1999 | Gonzalez et al. |
| 6,031,287 A | 2/2000 | Harshfield |
| 6,087,674 A | 7/2000 | Ovshinsky et al. |

(Continued)

OTHER PUBLICATIONS

U.S. Appl. No. 09/895,020, filed Jun. 30, 2001, to Chien Chiang et al.

*Primary Examiner*—Quoc D Hoang
(74) *Attorney, Agent, or Firm*—Trop, Pruner & Hu, P.C.

(57) ABSTRACT

A method comprising forming a first dielectric layer over an electrode formed to a first contact point on a substrate, the electrode having a contact area; patterning the first dielectric layer into a body, a thickness of the first dielectric layer defining a side wall; forming at least one spacer along the side wall of the first dielectric body, the at least one spacer overlying a portion of the contact area; forming a second dielectric layer on the contact area; removing the at least one spacer; and forming a material comprising a second contact point to the contact area. An apparatus comprising a volume of programmable material; a conductor; and an electrode disposed between the volume of programmable material and the conductor, the electrode having a contact area coupled to the volume of programmable material.

25 Claims, 16 Drawing Sheets

U.S. PATENT DOCUMENTS

| | | | |
|---|---|---|---|
| 6,153,890 A | 11/2000 | Wolstenholme et al. | |
| 6,229,157 B1 | 5/2001 | Sandhu | |
| 6,236,059 B1 * | 5/2001 | Wolstenholme et al. | 257/3 |
| 6,337,266 B1 * | 1/2002 | Zahorik | 438/618 |
| 6,339,544 B1 | 1/2002 | Chiang et al. | |
| 6,369,431 B1 | 4/2002 | Gonzalez et al. | |
| 6,404,665 B1 | 6/2002 | Lowrey et al. | |
| 6,429,064 B1 | 8/2002 | Wicker | |
| 6,597,009 B2 | 7/2003 | Wicker | |
| 6,605,527 B2 * | 8/2003 | Dennison et al. | 438/618 |
| 6,653,195 B1 * | 11/2003 | Gonzalez et al. | 438/380 |

* cited by examiner

REDUCED AREA INTERSECTION BETWEEN ELECTRODE AND PROGRAMMING ELEMENT

This is a continuation of application Ser. No. 09/896,531, filed Jun. 30, 2001 now U.S. Pat. No. 6,605,527.

BACKGROUND

1. Field

Programmable devices, including phase change memory devices that can be programmed by modifying the state of a phase change material.

2. Background

Typical computers, or computer related devices, include physical memory, usually referred to as main memory or random access memory (RAM). Generally, RAM is memory that is available to computer programs and read-only memory (ROM) is memory that is used, for example, to store programs that boot a computer and perform diagnostics. Typical memory applications include dynamic random access memory (DRAM), static random access memory (SRAM), erasable programmable read-only memory (EPROM), and electrically erasable programmable read-only memory (EEPROM).

Solid state memory devices typically employ micro-electronic circuit elements for each memory bit (e.g., one to six transistors per bit) in memory applications. Since one or more electronic circuit elements are required for each memory bit, these devices may consume considerable chip "real estate" to store a bit of information, which limits the density of a memory chip. The primary "non-volatile" memory element of these devices, such as an EEPROM, typically employ a floating gate field effect transistor device that has limited re-programmability and which holds a charge on the floating gate of the field effect transistor to store each memory bit. These classes of memory devices are also relatively slow to program and even slower when an erase cycle is required prior to programming as would be the case for truly random writes.

Phase change memory devices use phase change materials, i.e., materials that can be switched between a generally amorphous and a generally crystalline state, for electronic memory application. One type of memory element originally developed by Energy Conversion Devices, Inc. of Troy, Mich. utilizes a phase change material that can be, in one application, electrically switched between a structural state of generally amorphous and generally crystalline local order or between different detectable states of local order across the entire spectrum between completely amorphous and completely crystalline states. Typical materials suitable for such application include those utilizing various chalcogenide elements. These memory devices typically do not use field effect transistor devices or capacitors as the memory storage element, but comprise, in the electrical context, a monolithic body of thin film chalcogenide material. As a result, very little chip real estate is required to store a bit of information, thereby providing for inherently high density memory chips. The state change materials are also truly non-volatile in that, when set in either a crystalline, semi-crystalline, amorphous, or semi-amorphous state representing a resistance value, that value is retained until reprogrammed as that value represents a physical state of the material (e.g., crystalline or amorphous). Thus, phase change memory materials represent a significant improvement in non-volatile memory.

One characteristic common to solid state and phase change memory devices is significant power consumption particularly in setting or resetting memory elements. Power consumption is significant, particularly in portable devices that rely on power cells (e.g., batteries). It would be desirable to decrease the power consumption of a memory device.

DETAILED DESCRIPTION

In one embodiment, a technique for forming an area of intersection (a contact area) between an electrode and a programming element. By this technique, the area of intersection is not limited by the limitations associated with photolithography, notably feature size limitations. In general, the contact areas are defined in terms of film thickness rather than photolithography, which allows miniaturization beyond the feature size limits of photolithography. In terms of minimizing the contact area between a programmable material such as a phase change material and an electrode, minimizing the contact area reduces the power consumption necessary to program the phase change material.

In the following paragraphs and in association with the accompanying figures, an example of a memory array and a memory device is presented. The embodiment describes the programmable material including a phase change material when the phase of the material determines the state of the memory element.

Figure 1:
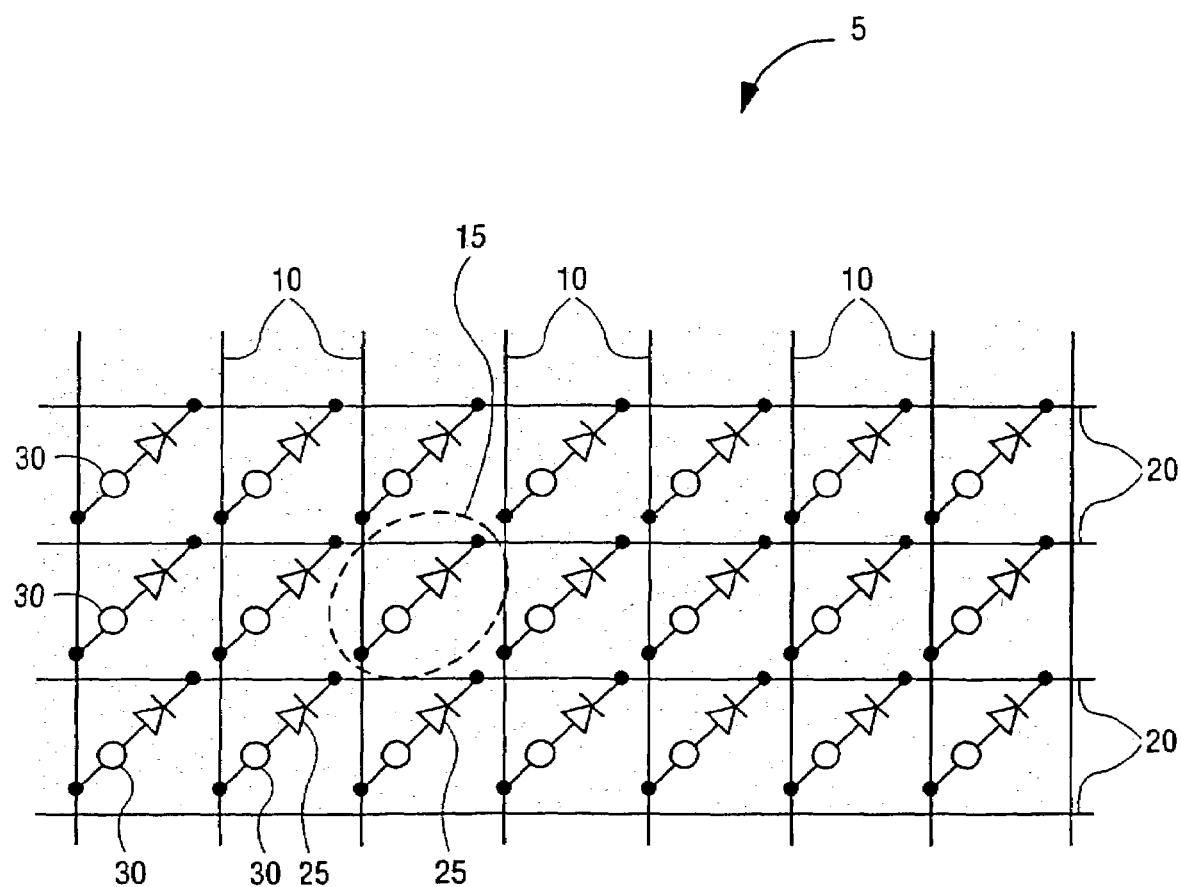
FIG. 1 is a schematic diagram of an array of memory elements.

FIG. 1 shows a schematic diagram of an embodiment of a memory array comprised of a plurality of memory elements presented and formed in the context of the invention. In this example, the circuit of memory array 5 includes an xy grid with memory element 30 electrically interconnected in series with isolation device 25 on a portion of a chip. Address lines 10 (e.g., columns) and 20 (e.g., rows) are connected, in one embodiment, to external addressing circuitry. One purpose of the xy grid array of memory elements in combination with isolation devices is to enable each discrete memory element to be read and written without interfering with the information stored in adjacent or remote memory elements of the array.

A memory array such as memory array 5 may be formed in a portion, including the entire portion, of a substrate. A typical substrate includes a semiconductor substrate such as a silicon substrate. Other substrates including, but not limited to, substrates that contain ceramic material, organic material, or glass material as part of the infrastructure are also suitable. In the case of a silicon semiconductor substrate, memory array 5 may be fabricated over an area of the substrate at the wafer level and then the wafer reduced through singulation into discrete die or chips, some or all of the die or chips having a memory array formed thereon. Additional addressing circuitry (e.g., decoders, etc.) may be formed in a similar fashion.

Figure 2:
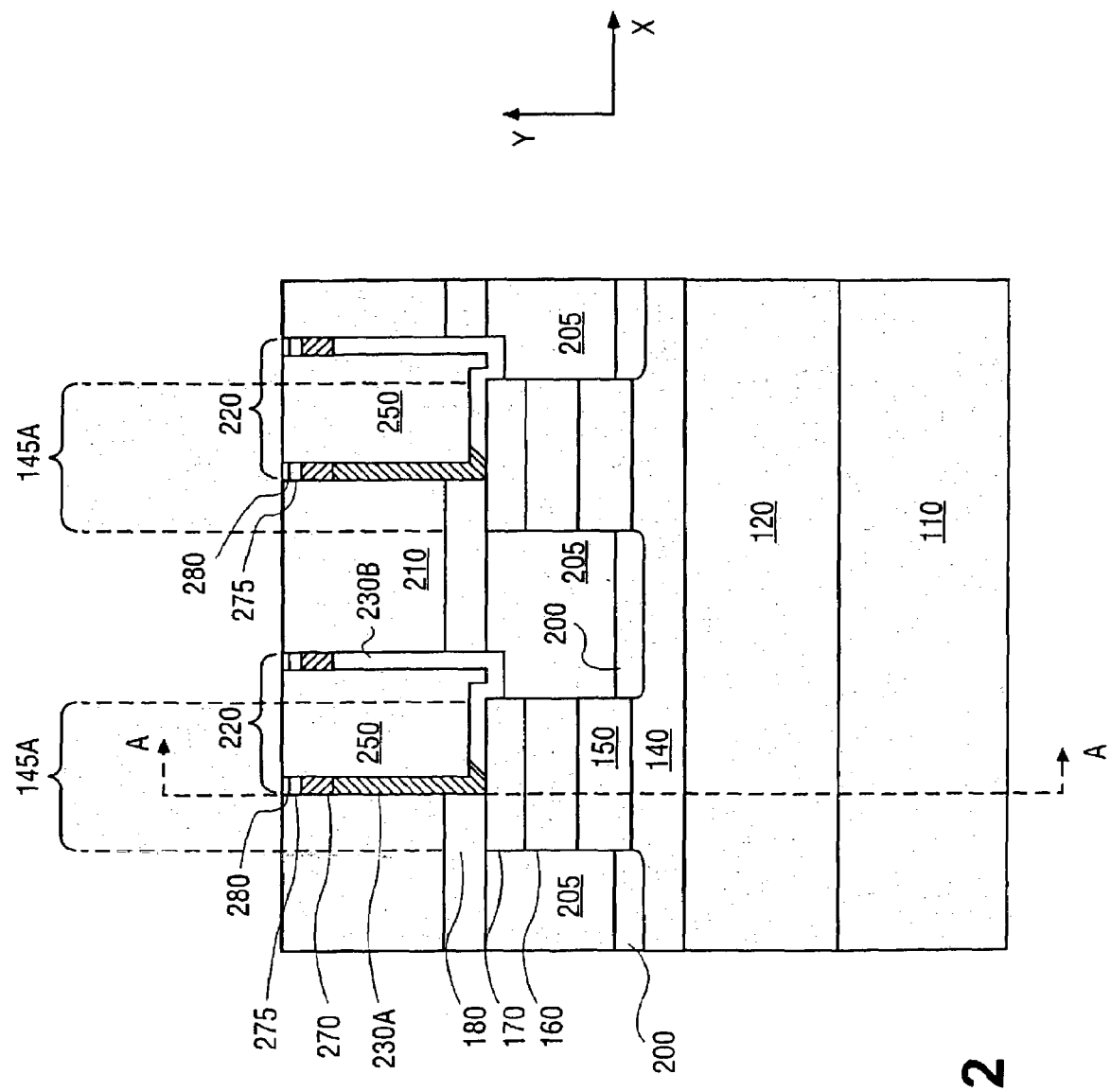
FIG. 2 schematically shows a cross-sectional planar side view of a portion of a substrate having electrodes coupled to conductors or signal lines on the substrate as a portion of an embodiment of memory cell element.
Figure 3:
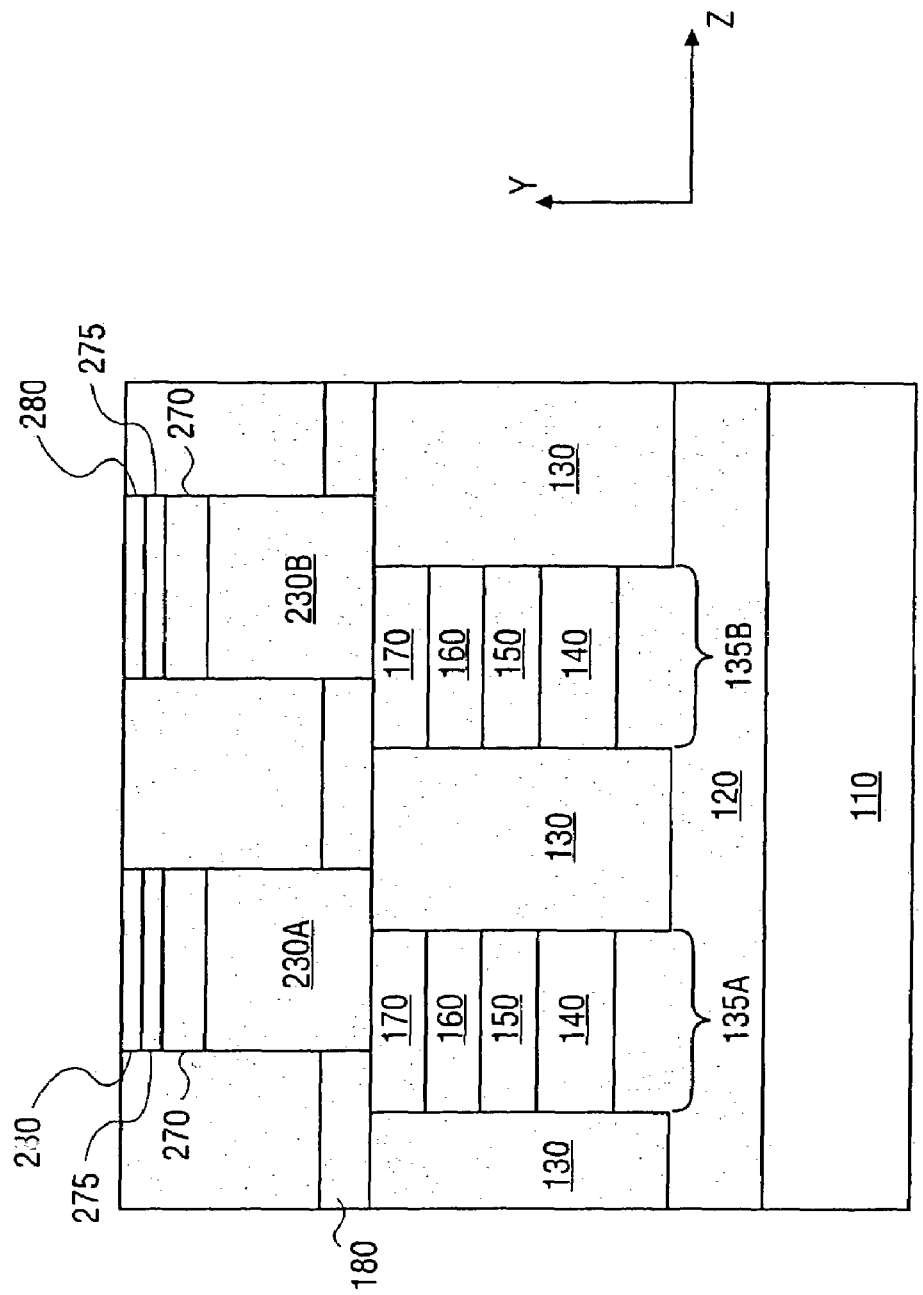
FIG. 3 shows a cross-sectional planar side view through line A-A' of FIG. 2.

FIGS. 2-19 illustrate an embodiment of the fabrication of representative memory element 15 of FIG. 1. FIG. 2 and FIG. 3 show a structure from an xy-direction and a yz-direction, respectively. FIG. 2 and FIG. 3 show a portion of a memory element (e.g., memory element 15) including, as will be described, a signal line or conductor (e.g., row line 20 of FIG. 1), an isolation device (e.g., isolation device 25 of FIG. 1) and an electrode.

Referring to. FIG. 2 and FIG. 3, there is shown a portion of substrate 100 that is, for example, a semiconductor substrate. In this example, a P-type dopant such as boron is introduced in portion 110. In one example, a suitable concentration of P-type dopant is on the order of above $5\times10^{19}$-$1\times10^{20}$ atoms per cubic centimeters (atoms/cm$^3$) rendering portion 110 of substrate 100 representatively P$^{++}$. Overlying portion 110 of substrate 100, in this example, is portion 120 of P-type epitaxial silicon. In one example, the dopant concentration is on the order of about $10^{16}$-$10^{17}$ atoms/cm$^3$.

FIG. 3 shows shallow trench isolation (STI) structures 130 formed in epitaxial portion 120 of substrate 100. As will become apparent in the subsequent discussion, STI structures 130 serve, in one aspect, to define the z-direction thickness of a memory element cell, with at this point only the z-direction thickness of a memory element cell defined. In another aspect, STI structures 130 serve to isolate individual memory elements from one another as well as associated circuit elements (e.g., transistor devices) formed in and on the substrate.

FIG. 3 also shows memory cell regions 135A and 135B introduced as strips with the x-direction dimension greater than the z-direction dimension. Overlying epitaxial portion 120 of substrate 100 is first conductor or signal line material 140. In one example, first conductor or signal line material 140 is N-type doped silicon formed by the introduction of, for example, phosphorous or arsenic to a concentration on the order of about $10^{18}$-$10^{19}$ atoms/cm$^3$ (e.g., N$^+$ silicon). In this example, first conductor or signal line material 140 serves as an address line, a row line (e.g., row line 20 of FIG. 1). Overlying first conductor or signal line material 140 is an isolation device (e.g., isolation device 25 of FIG. 1). In this example, the isolation device is a PN diode formed of N-type silicon portion 150 (dopant concentration on the order of about $10^{17}$-$10^{18}$ atoms/cm$^3$) and P-type silicon portion 160 (dopant concentration on the order of about $10^{19}$-$10^{20}$ atoms/cm$^3$). Although a PN diode is shown, it is to be appreciated that other isolation structures are similarly suitable. Such devices include, but are not limited to, metal oxide semiconductor (MOS) devices.

Following the formation of first conductor or signal line 140 and isolation device 25, the x-direction dimension of memory cells 145A and 145B may be formed, again by STI techniques. FIG. 2 shows trenches formed adjacent memory cells 145A and 145B. Following trench formation, N-type dopant may be introduced between memory cells (e.g., between memory cells 145A and 145B) to form pockets 200 having a dopant concentration on the order of about $10^{18}$ to $10^{20}$ atoms/cm$^3$ (e.g., N$^+$ region). FIG. 2 also shows dielectric material 205 of, for example, silicon dioxide as STI structures between memory cells 145A and 145B.

Referring to FIG. 2 and FIG. 3, overlying the isolation device (e.g., isolation device 25) in each of memory cell 145A and 145B is reducer material 170 of, in this example, a refractory metal silicide such as cobalt silicide (CoSi$_2$). Reducer material 170, in one aspect, serves as a low resistance material in the fabrication of peripheral circuitry (e.g., addressing circuitry) of the circuit structure on the chip in this instance. Thus, reducer material 170 is not required in terms of forming a memory element as described. Nevertheless, because of its generally low resistance property, its inclusion as part of the memory cell structure between isolation device 25 and memory element 30 (see FIG. 1) is utilized in this embodiment. Reducer material 170 may be formed by introducing a refractory metal (e.g., cobalt) into a portion of P-type silicon portion 160.

Referring to FIG. 2, dielectric material 180 overlies reducer material 170 and serves, in one embodiment, as an etch stop for a subsequent opening to reducer material 170. Dielectric material 180 is, for example, silicon nitride (Si$_3$N$_4$).

Referring to FIG. 2 and FIG. 3, dielectric material 210 is introduced over the structure to a thickness on the order of 100 Å to 50,000 Å; enough to encapsulate the memory cell material and to define (possibly after planarization) a y-direction thickness (height) of an electrode material. In one embodiment, dielectric material 210 is silicon dioxide (SiO$_2$). In another embodiment, dielectric material 210 is a material selected for its reduced thermal conductivity, κ, preferably a thermal conductivity less than $\kappa_{SiO_2}$, more preferably three to 10 times less $\kappa_{SiO_2}$. As a general convention, SiO$_2$ has a κ value on the order of 1.0. Thus, suitable materials for dielectric material 210 include those materials that have κ values less than 1.0. Certain high temperature polymers having κ values less than 1.0, carbide materials, Aerogel, Xerogel (κ on the order of 0.1) and their derivatives.

Referring to FIG. 2, trenches are formed through dielectric material. 210 and masking material 180 to reducer material 170. An electrode material of, for example, polycrystalline semiconductor material such as polycrystalline silicon is then conformally introduced along the side walls of the trench. Other suitable materials include carbon and semi-metals such as transition metals including, but not limited to, titanium, titanium-tungsten (TiW), titanium nitride (TiN) and titanium aluminum nitride (TiAlN). The introduction is conformal in the sense that electrode material 230 is introduced along the side walls and base of trench 220 such that electrode material 230 is in contact with reducer material 170.

In the example described, it is preferable that only a portion of the electrode material extending in the figures in a y-direction, i.e., only one of two "leg portions" extending in a y-direction, constitutes the area of contact with the subsequently introduced memory material. Accordingly, in the case of non-conductive material selected for electrode material 230, such as intrinsic polycrystalline silicon, one of the two leg portions of electrode material 230 is rendered conductive for a conductive path to first conductor or signal line material 140. For polycrystalline silicon for electrode material 230, the conductivity of the material may be increased by doping techniques, by for example angled ion implantation into the desired leg portion. In the case of conductive material selected for electrode material 230, an otherwise conductive path between the non-selected leg portion and first conductor or signal line material 140 may be terminated by, for example introducing a dielectric material between the electrode material and the memory material or by removing a portion of the electrode material by, for example, etching.

FIG. 2 shows the structure where only one of the leg portions of the electrode material serves as a conductive path between first conductor or signal line material 140 and a subsequently introduced memory material. In this example, electrode material 230 is a generally non-conductive intrinsic polycrystalline silicon. After the introduction of a dopant into a portion of electrode material 230, two portions are defined, electrode material 230A and electrode material 230B. As illustrated, electrode material 230A is doped about its length from reducer material 170 and will act as a conductive path between first conductor or signal line material 140 and subsequently introduced memory material. Electrode material 230B is generally non-conductive (e.g., predominantly intrinsic polycrystalline silicon) and thus will generally not serve as a conductive path.

FIG. 2 also shows the introduction of dielectric material 250 into trenches 220. In one embodiment, dielectric material 250 is silicon dioxide ($SiO_2$). In another embodiment dielectric material 250 is a material that has a thermal conductivity, $\kappa$, that is less than the thermal conductivity of $SiO_2$, $\kappa_{SiO_2}$, preferably three to 10 times less than $\kappa_{SiO_2}$. Following introduction, the structure is subjected to a planarization that removes the horizontal component of electrode material 230. Suitable planarization techniques include those known to those of skill in the art, such as chemical or chemical-mechanical polish (CMP) techniques.

Modifying species may be introduced into a portion of electrode material 230A to raise the local resistance of electrode material 230A at portion 270 of the electrode material. Electrode material portion 270 of polycrystalline silicon and $SiO_2$, $Si_3N_4$, $Si_xO_yN_z$, or SiC generally has a higher resistivity than doped polycrystalline silicon of electrode material 230A. Suitable materials for modifying species also include those materials that are introduced (e.g., added, reacted, or combined) into electrode material 230A and raise the resistivity value within the electrode (e.g., raise the local resistance near a volume of memory material), and the resistivity value is also stable at high temperatures. Such modifying species may be introduced by way of implantation or thermal means with, for example, a gaseous ambient.

FIG. 2 still further shows the structure with the electrode having optional barrier materials 275 and 280. Barrier material 275 is, for example, titanium silicide ($TiSi_2$) introduced to a thickness on the order of about 100-300 Å. Barrier material 280 is, for example, titanium nitride (TiN) similarly introduced to a thickness on the order of about 25-300 Å.

Figure 4:
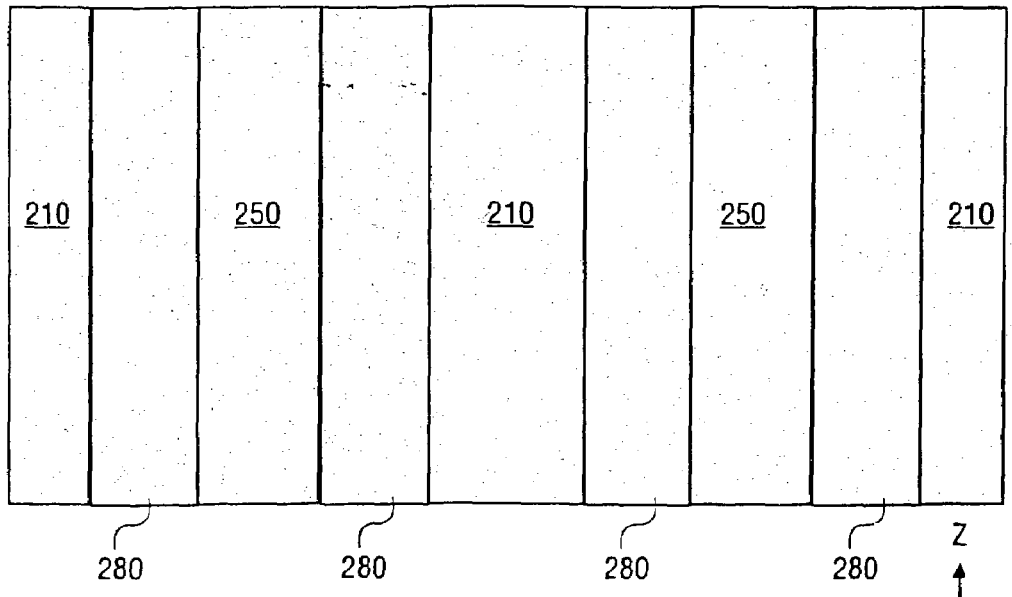
FIG. 4 shows a planar top view of the structure of FIG. 2.

FIG. 4 shows a planar top view of the structure of FIG. 2 and FIG. 3. In this view, electrode material (illustrated by barrier material 280) is formed in strips through a portion of the structure. Programmable material will be formed on electrode material 280. In one embodiment, it is desired to minimize the contact area between electrode material and subsequently formed programmable material. As used herein, the terminology "area of contact" or "contact area" is the portion of the surface of an electrode contact to which the electrode material electrically communicates with the programmable material. In one embodiment, substantially all electrical communication between the programmable material and the electrode material occurs through all or a portion of an edge of the electrode material. That is, only an edge or a portion of an edge of the electrode material is adjacent to the programmable material. The electrode material need not actually physically contact the programmable material. It is sufficient that the electrode material is in electrical communication with the programmable material. In one aspect, it is desired to reduce the area of contact of the electrode material to the programmable material.

Figure 5:
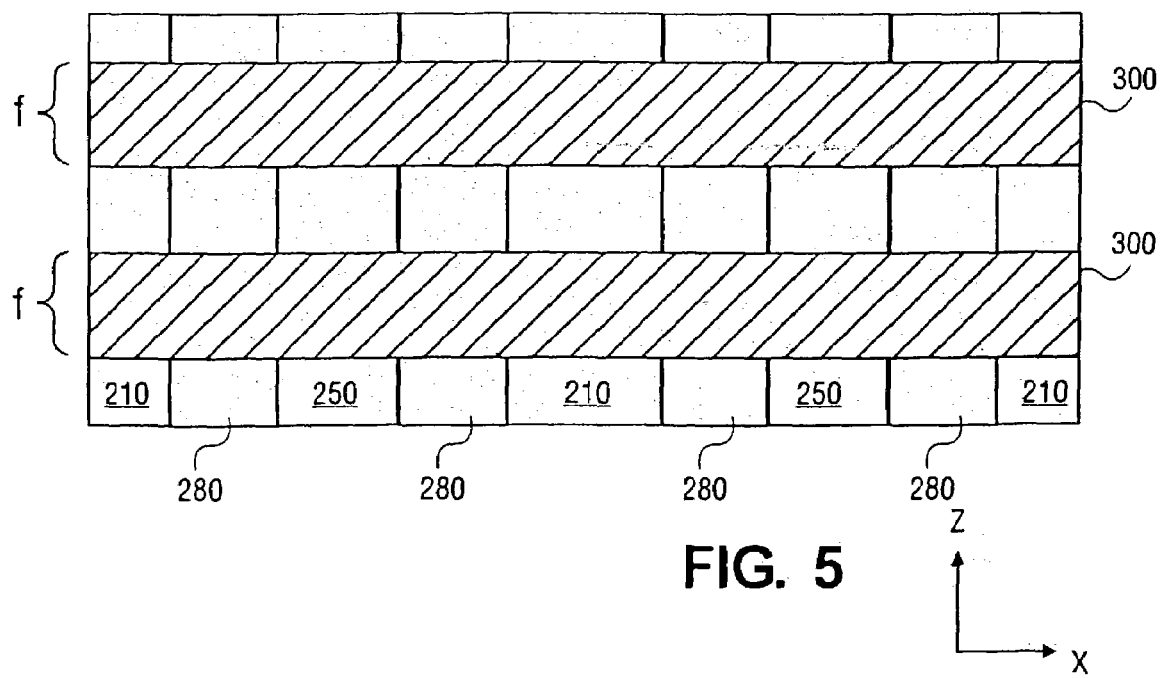
FIG. 5 shows a planar top view of the structure of FIG. 4 following the introduction and patterning of masking material over the structure.

Referring to FIG. 5, in one embodiment, the "strips" of electrode material are partitioned to reduce the area of contact (contact area) between subsequently formed programmable material and the electrode material. In one embodiment, it is desired to reduce the area of contact by minimizing the area of electrode material to a minimal feature size. According to current technology, a minimal feature size using photolithographic techniques is approximately 0.25 microns ($\mu$m). FIG. 5 shows the structure of FIG. 4 following the introduction of masking material 300 over a surface of the structure patterned, in one example, to define a feature size, f, of electrode material available for contact to programmable material.

Figure 6:
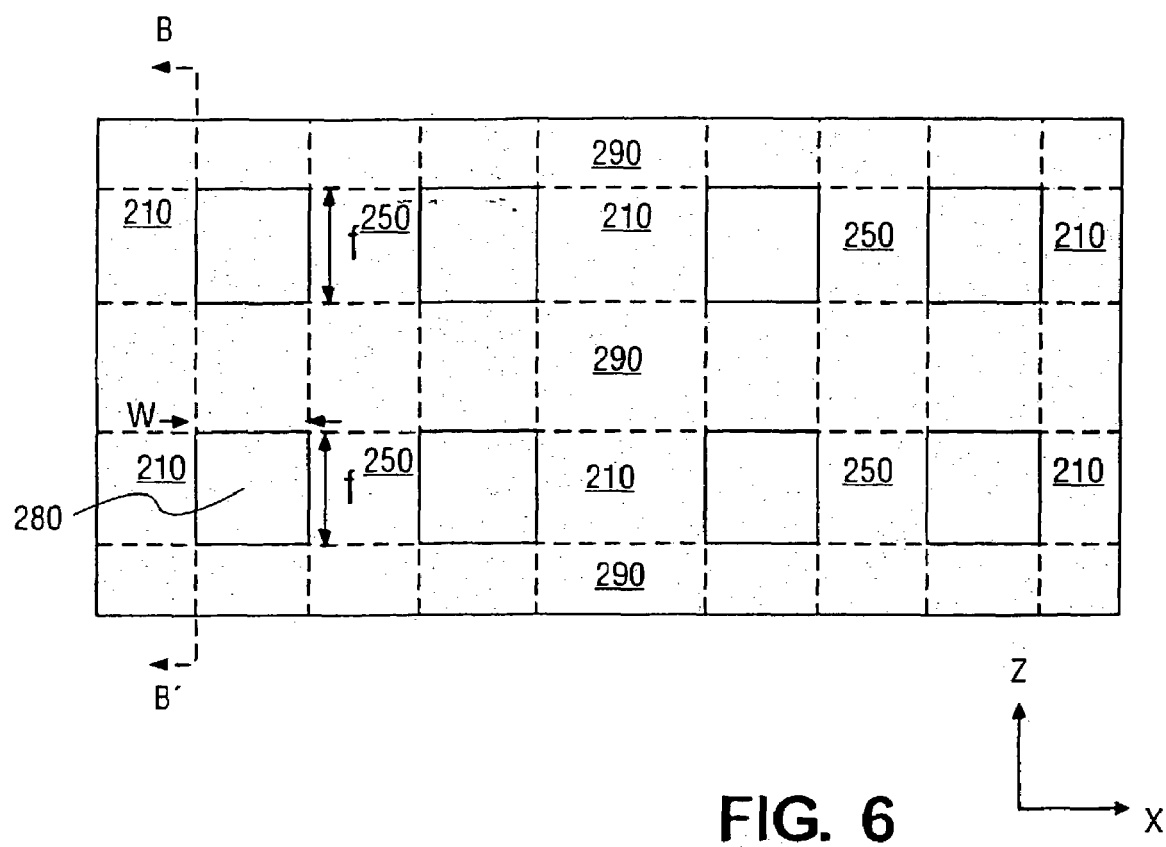
FIG. 6 shows the structure of FIG. 5 after forming trenches in the structure according to the patterned masking material, removing the masking material, and forming a dielectric in the trenches.

Forming the electrode material of the desired feature size involves, in one embodiment, etching to partition the electrode material from strips into individual units. FIG. 6 shows the structure of FIG. 5 following the patterning (e.g., etching) of electrode material. Following etching, dielectric material 290 of, for example, silicon dioxide ($SiO_2$) is introduced (e.g., by chemical vapor deposition (CVD)). At this point, the surface of the structure is planarized.

In the representation shown in FIG. 6, the electrode material strips have been partitioned into area portions each having a width, w, equivalent to the thickness of the deposited electrode layer or film, and a length, f, equivalent to the feature size following photolithographic patterning. Thus, the minimal area is determined by the photolithographic minimum. Thus, the area of contact, at this point, would be the width, w, times the feature size, f. A representative width, w, for an electrode material film according to current technologies is on the order of 250 angstroms (Å).

Figure 7:
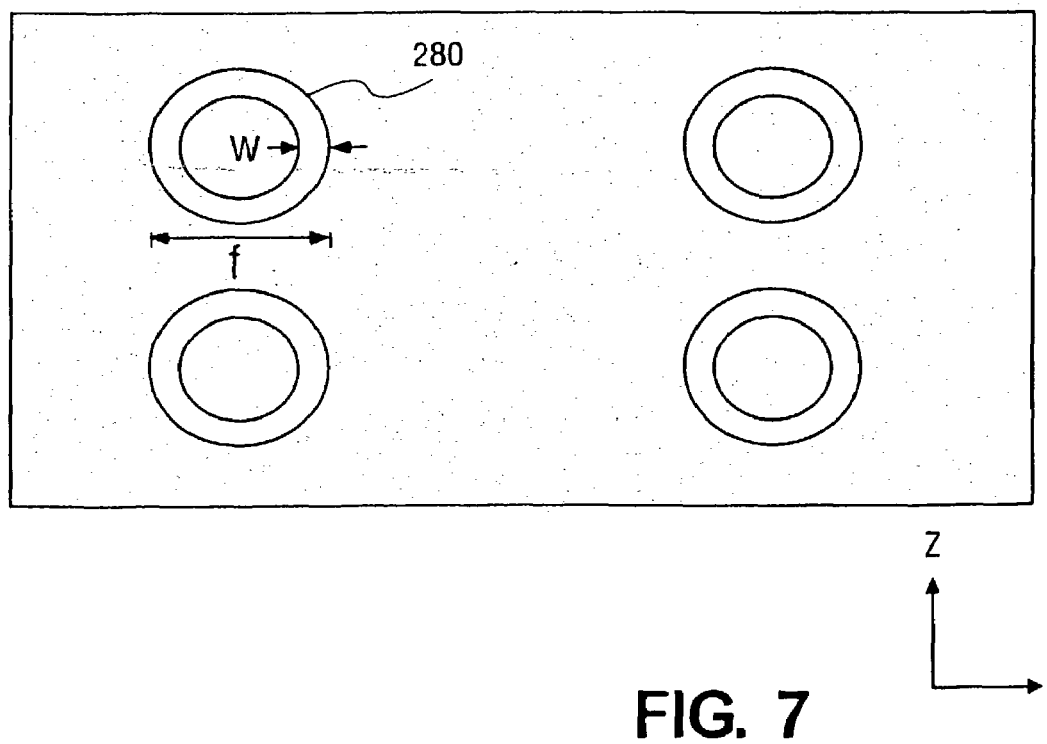
FIG. 7 shows a planar top view of an alternative embodiment of electrodes formed on a substrate, such as a substrate described above with reference to FIG. 2.

FIG. 7 shows an alternative embodiment wherein the electrode material is patterned as circular rings by, for example, depositing electrode material along the side walls of circular trench openings. In this case, the formed circular openings have a feature size, f. The minimal electrode area for contact with a programmable material is $\pi \times f \times w$.

Figure 8:
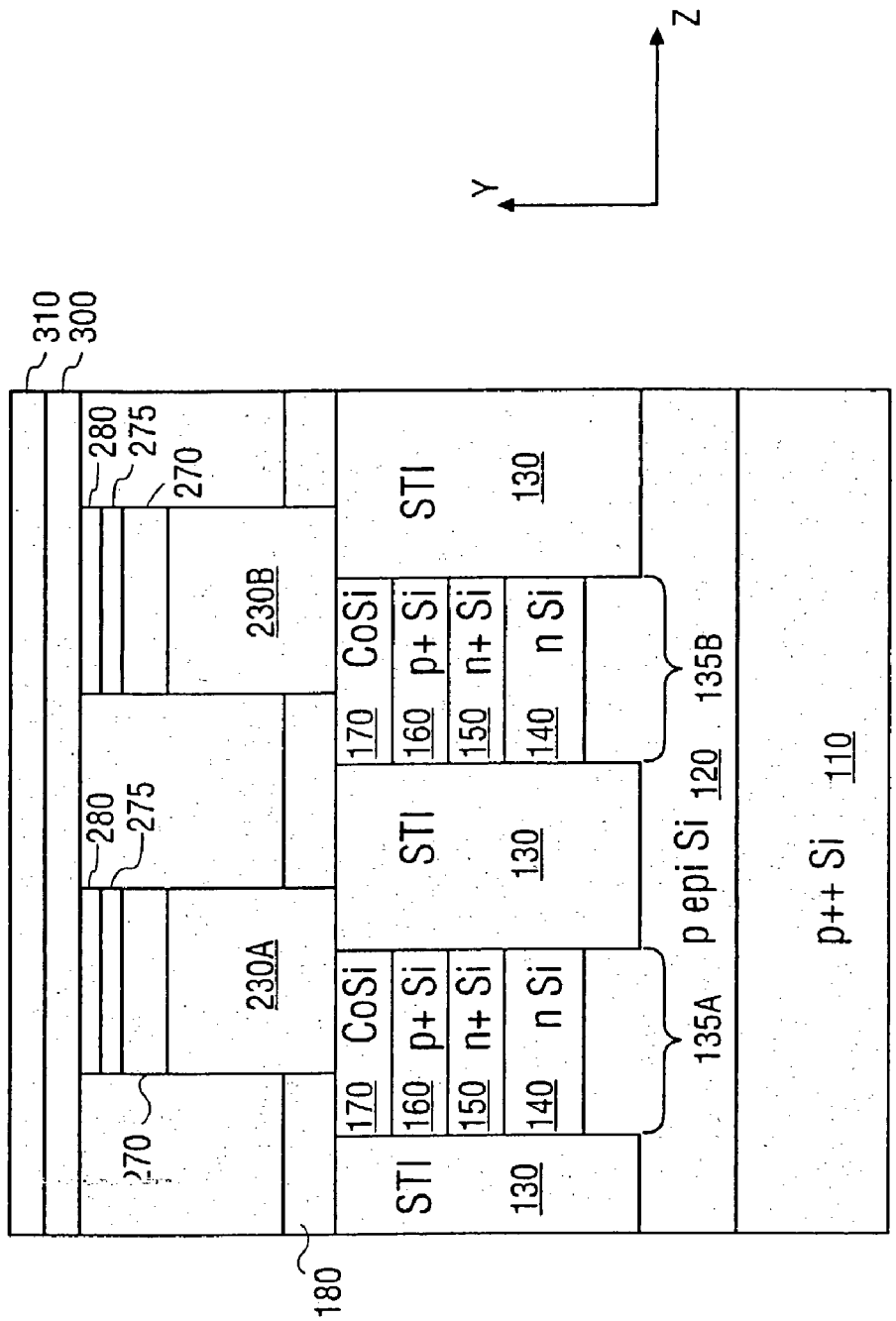
FIG. 8 shows a cross-sectional planar side view of the structure of FIG. 6 through line B-B' following the introduction of a first dielectric layer and a second dielectric layer over the substrate.

In either the representation shown in FIG. 6 or in FIG. 7, it is desired to decrease the contact area of the electrode material with the programmable material, preferably beyond the limits established by photolithography. FIGS. 8-17 describe a process whereby the contact area may be minimized. FIG. 8 shows the structure of FIG. 6 through lines B-B'. Following the patterning of the electrode material into minimum-feature size structures.

Over the planarized superior surface (as viewed) in FIG. 8, first dielectric material 300 is formed. First dielectric layer 300 is, for example, silicon dioxide deposited by CVD. A thickness on the order of 200 Å or less is suitable. Formed on first dielectric layer 300 in FIG. 8 is second dielectric layer 310. In one example, second dielectric layer 310 is a material having a different etch characteristic than first dielectric layer 300 (e.g., for a particular etch chemistry, one of first dielectric layer 300 or second dielectric layer 310 may be selectively etched (removed) to the (virtual) exclusion of the other of first dielectric layer 300 and second dielectric layer 310). A suitable material for second dielectric layer 310 where first dielectric layer 300 is $SiO_2$ is, for example, silicon nitride ($Si_3N_4$). In one example, second dielectric layer 310 of silicon nitride is deposited by CVD to a thickness on the order of 800 Å.

Figure 9:
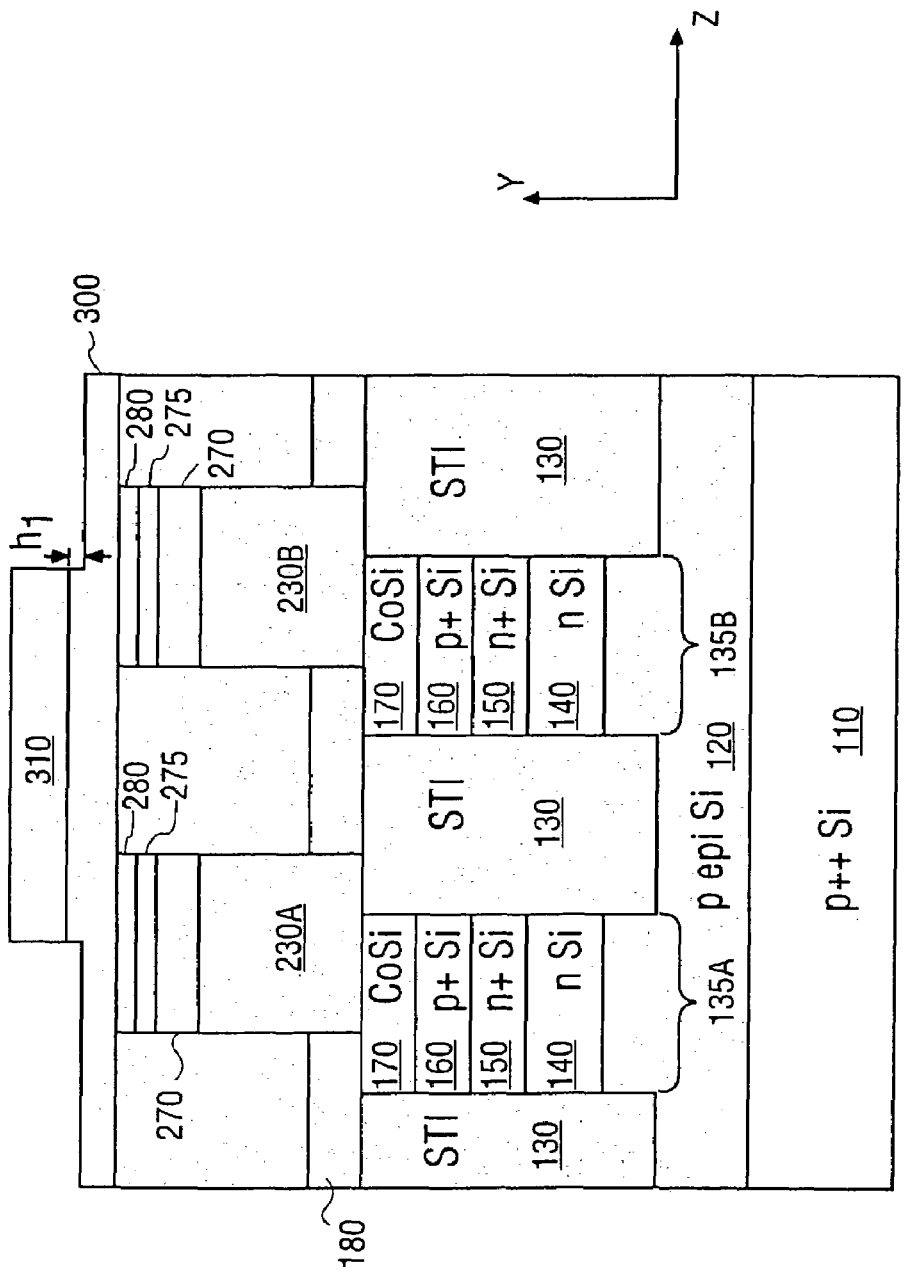
FIG. 9 shows the structure of FIG. 8 following the patterning of the second dielectric layer to overly a portion of an electrode.

FIG. 9 shows the structure of FIG. 8 following the patterning of second dielectric layer 310. In this embodiment, second dielectric layer 310 is patterned such that a body of sacrificial material overlies, in this view, less than the entire portion of the electrode material over which it is formed. In FIG. 9, the body of second dielectric layer 310, as patterned, overlies a portion (less than the entire portion) of adjacent electrode material structures. Second dielectric layer 310 may be patterned to overlie a portion of electrode material structures by photolithography techniques with etch patterning employed to remove the second dielectric material from other areas. FIG. 9 also shows an etch to remove second dielectric material over a portion of each of the viewed electrode material portions proceeds partially into first dielectric layer 300. Etching a distance, $h_1$, into first dielectric layer 300, on the order of about 25 Å or less serves, in one aspect, to inhibit undercutting in later processing. For an 800 Å thick second dielectric layer 310 of silicon nitride, this may be achieved using an etch chemistry with, for example, a three to one selectivity of silicon nitride to silicon dioxide.

Figure 10:
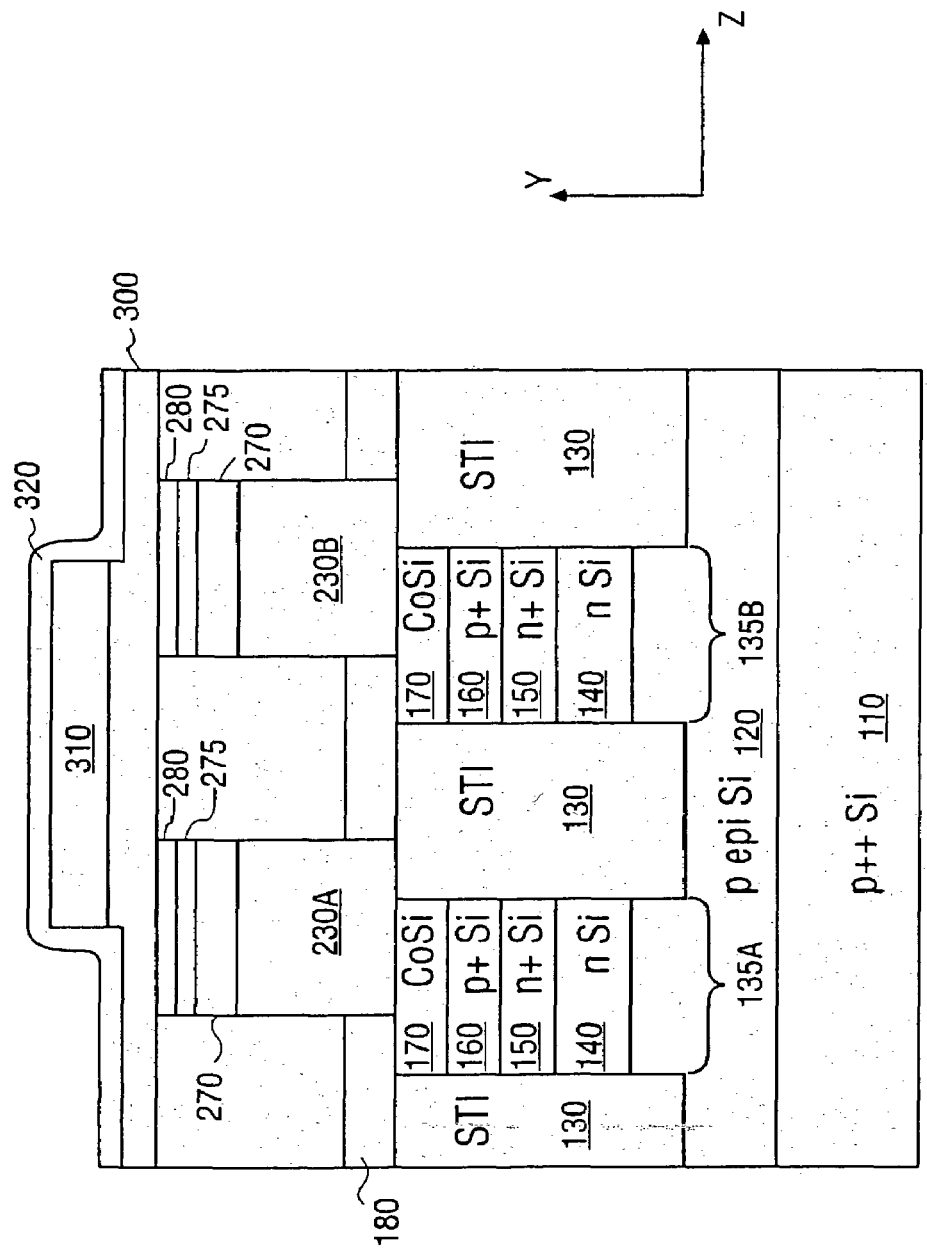
FIG. 10 shows the structure of FIG. 9 following the introduction of a layer of spacer material.

FIG. 10 shows the structure of FIG. 9 following the introduction of spacer material 320. In this example spacer material 320 is deposited conformally over the superior surface of the structure (as viewed), including over second dielectric layer 310 and first dielectric layer 300. Spacer material 320 is, for example, a material that may be selectively removed to the virtual exclusion of second dielectric layer 310 (e.g., a material having a different etch characteristic than an etch characteristic of the material of second dielectric layer 310 for a given etch chemistry. Where second dielectric layer 310 is silicon dioxide, spacer material is, for example, polycrystalline silicon (polysilicon). In this example, an amount (film thickness) of spacer material 320 is targeted to achieve on the order of about 300 Å to 500 Å and preferably 350 Å on the sidewalls of the patterned body of second dielectric layer 310, following spacer formation (see FIG. 11). This can be achieved, for example, by CVD targeted to a layer or film thickness of about 400 Å.

Figure 11:
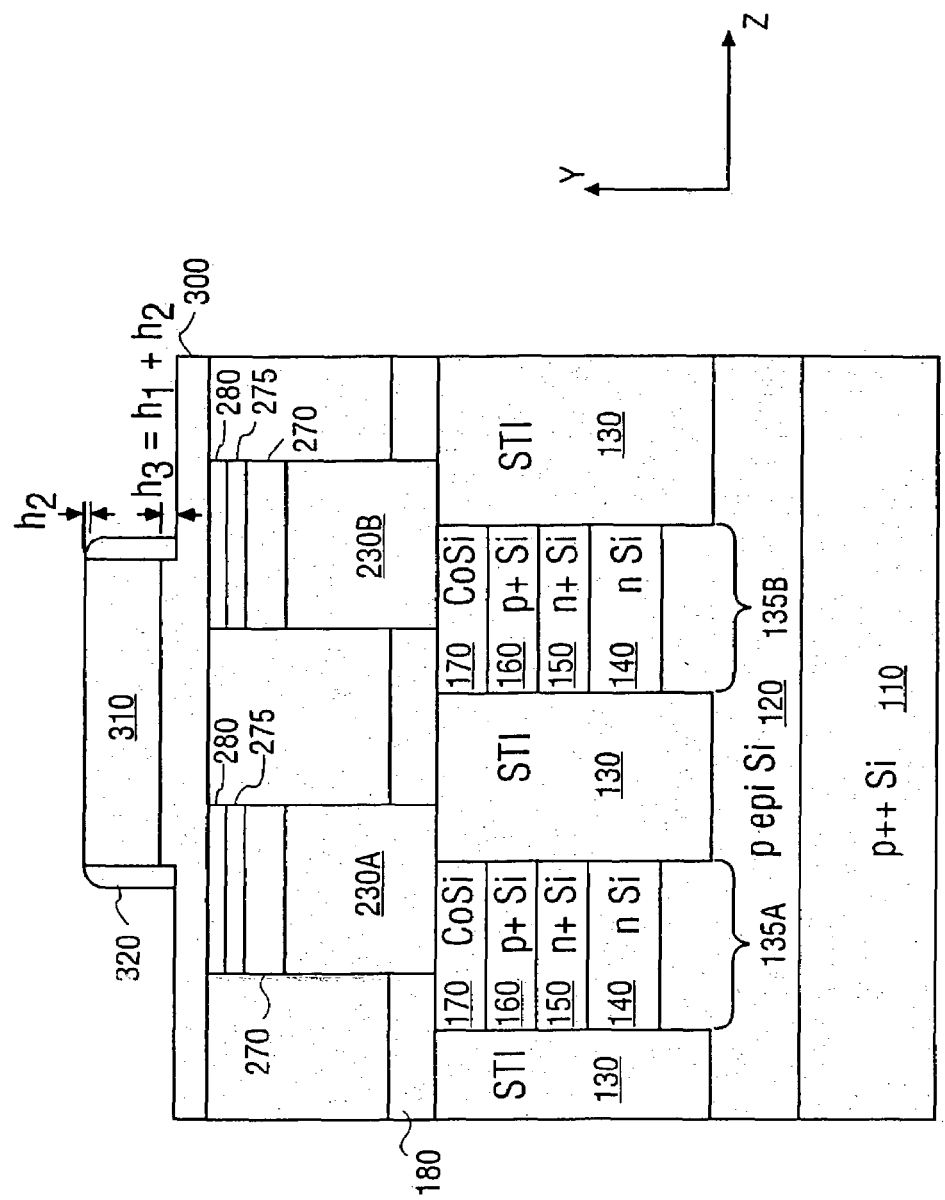
FIG. 11 shows the structure of FIG. 10 following an anisotropic spacer etch to expose the second dielectric layer.

FIG. 11 shows the structure of FIG. 10 following the anisotropic etch of spacer material 320 to expose a superior surface (as viewed) of second dielectric layer 310 (i.e., the superior surface of the patterned body of second dielectric layer 310). Spacer material 320 is retained along the side walls (the y-direction side walls) of second dielectric layer 310 but the lateral portions (in this view) along the z-direction of spacer material 320 are removed. Accordingly, in one example, approximately 350 Å thickness of spacer material is retained on the side walls of second dielectric layer 310. As shown in FIG. 11, the removal of spacer material by, for example, an anisotropic etch may proceed into a portion of first dielectric layer 300 (e.g., to a depth on the order of about 30 Å) so that a thickness, $h_3$, of first dielectric layer 300 is removed, equivalent to the amount, $h_1$, removed in patterning second dielectric layer 310 plus the amount, $h_2$, removed in the removal of spacer material 320.

Figure 12:
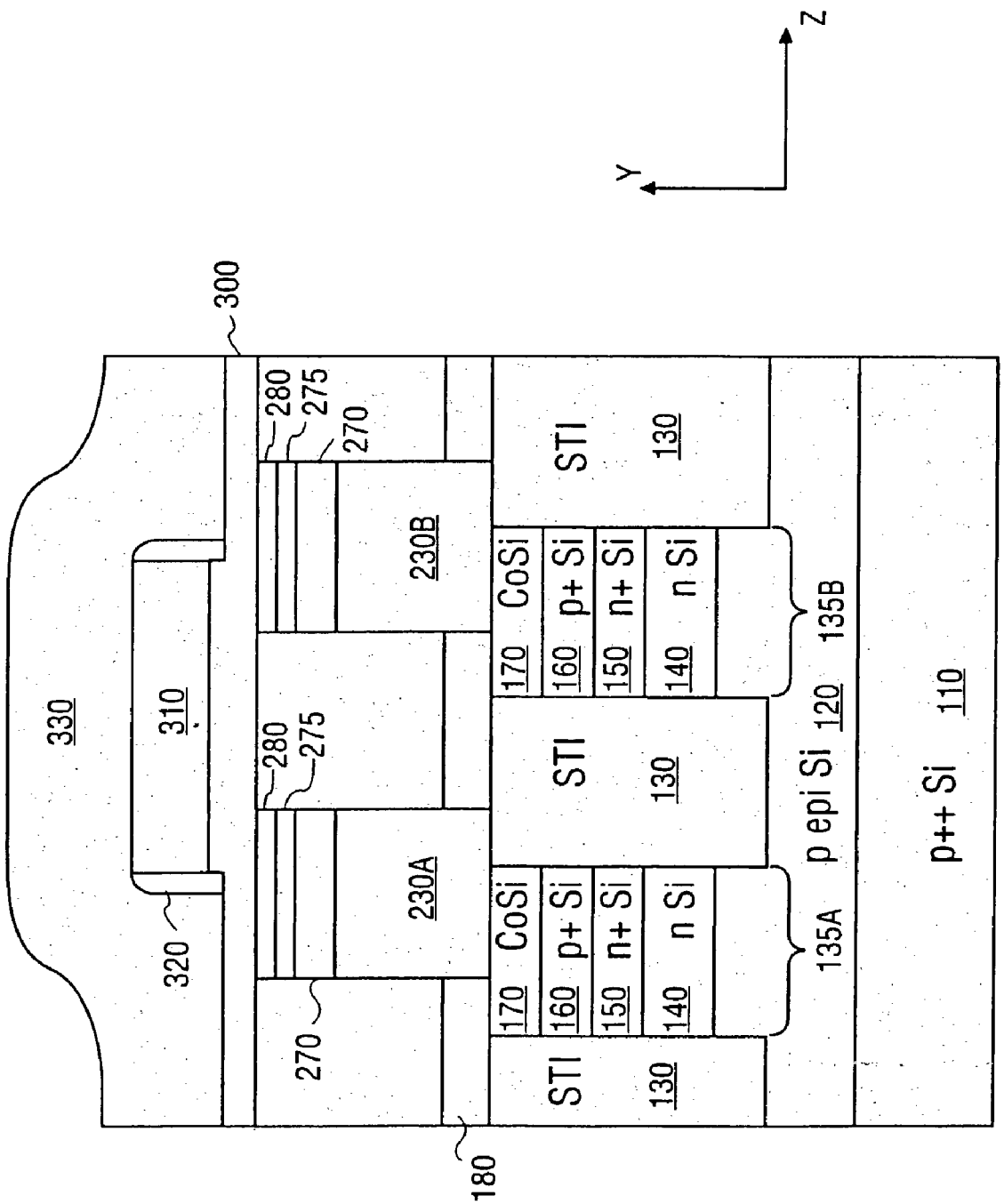
FIG. 12 shows the structure of FIG. 11 following the introduction of third dielectric layer.

FIG. 12 shows the structure of FIG. 11 following the introduction of third dielectric layer 330. In one embodiment, third dielectric layer 330 is deposited conformally over the superior surface of the structure (as viewed), including over first dielectric layer 300, spacer material 320, and second dielectric layer 310. Third dielectric layer 330 is, for example, a material that may be selectively retained in a subsequent process to remove spacer material 320 (e.g., a material having a different etch characteristic than spacer material 320 for a given etch chemistry). Where spacer material 320 is polycrystalline silicon, third dielectric layer 330 is, for example, silicon dioxide.

In one embodiment, it is desired to conformally deposit third dielectric layer 330 over the structure with minimum voids or gaps due, for example, due to the pattern (topological pattern) over which third dielectric layer 330 is introduced. Third dielectric layer 330 of an oxide may be deposited by high density plasma (HDP) to improve gap fill. In one embodiment, third dielectric layer 330 is introduced to a thickness on the order of about 1200 to 3000 Å (e.g., 1.5 to 2.5 times the thickness of second dielectric layer 310) or enough to blanket the structure and to allow for a subsequent planarization operation to expose spacer material 320.

Figure 13:
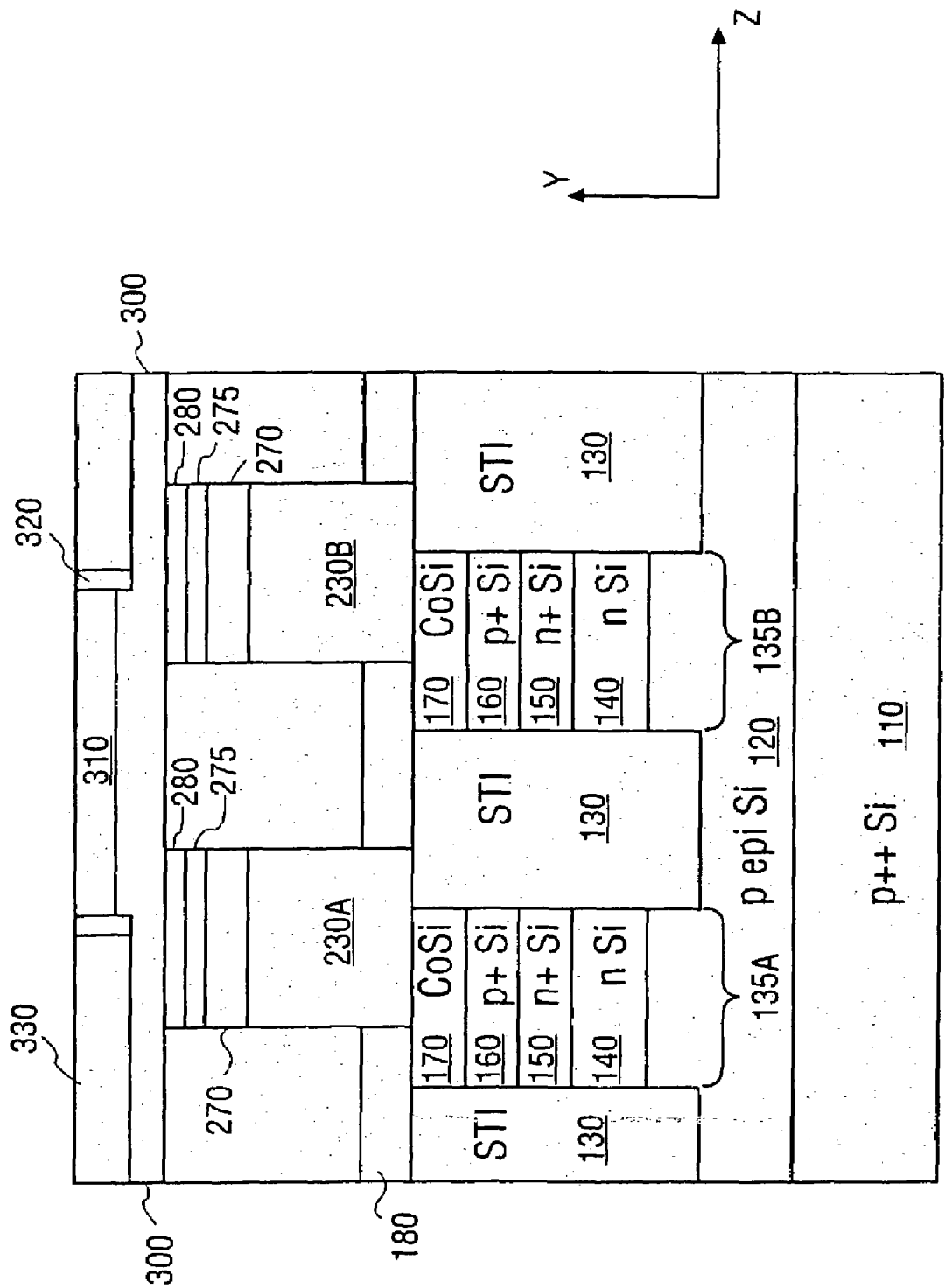
FIG. 13 shows the structure of FIG. 12 following the planarization of a surface of the structure and exposure of the spacer material.

FIG. 13 shows the structure of FIG. 12 following the planarization of the structure surface (the superior surface, as viewed) to expose spacer material 320. In one embodiment, the planarization is accomplished through a chemical-mechanical polish of third dielectric layer 330. The polish slows down when second dielectric layer 310 is exposed. Starting from a layer or film thickness for second dielectric layer 310 of approximately 750 to 800 Å (y-direction thickness), a polish that removes approximately 300 to 350 Å of second dielectric layer 310 (leaving approximately 400 Å±200 Å) is suitable.

Figure 14:
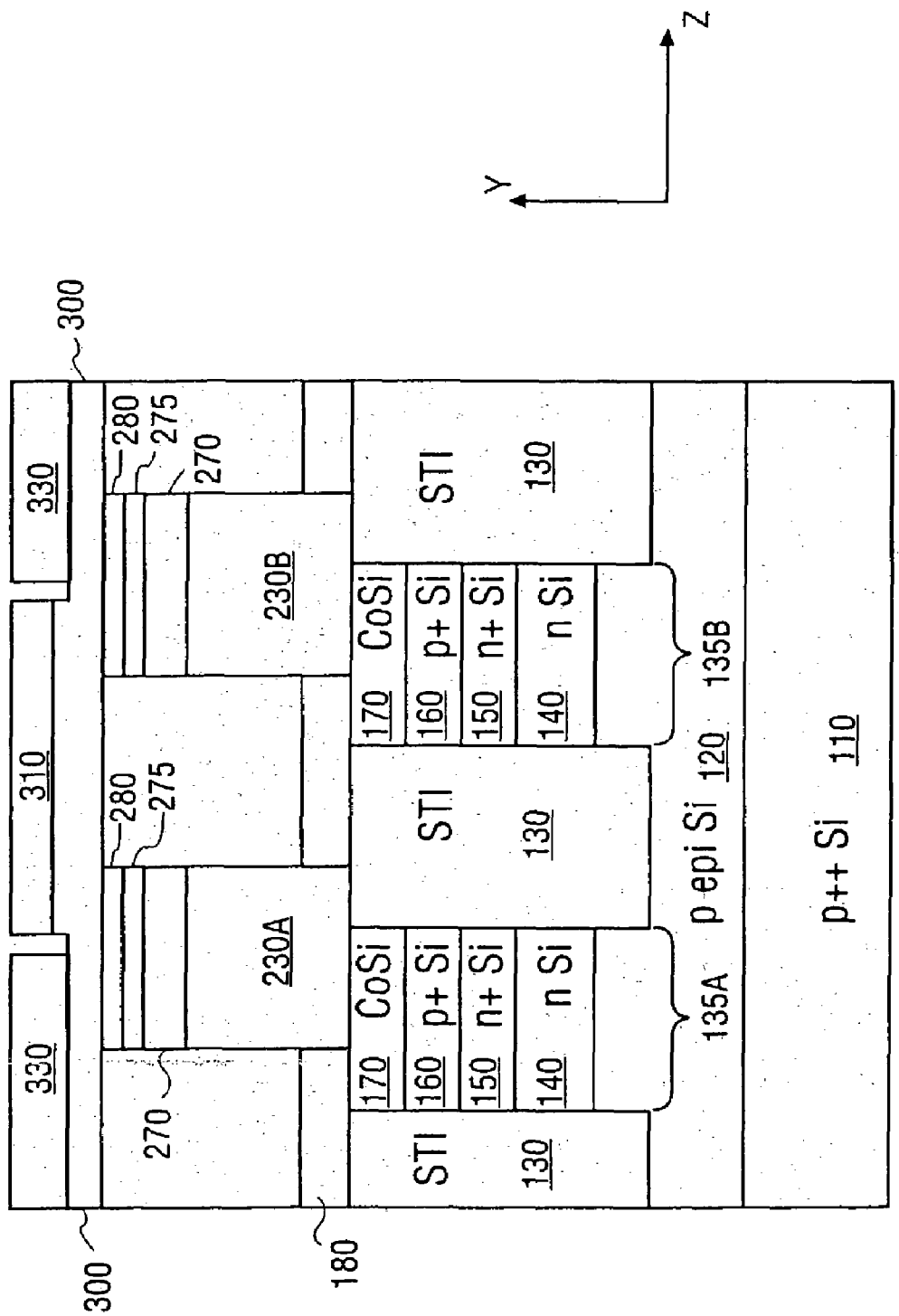
FIG. 14 shows the structure of FIG. 13 following the removal of the spacer material.

FIG. 14 shows the structure of FIG. 13 following the removal of spacer material 320. Spacer material 320 was exposed in the planarization operation describe with reference to FIG. 13. Where spacer material 320 is polycrystalline silicon, a selective etch of spacer material 320 may be accomplished, for example, by a wet etch with a potassium hydroxide (KOH) and isopropyl alcohol chemistry or a dry plasma etch of a $SF_6/He/O_2$ or $CF_4/O_2$ chemistry. The etch is selective for spacer material 320 and, therefore remaining first dielectric layer portion 300 over the electrode material is retained as is, in this embodiment, second dielectric layer 310 and third dielectric layer 330.

Figure 15:
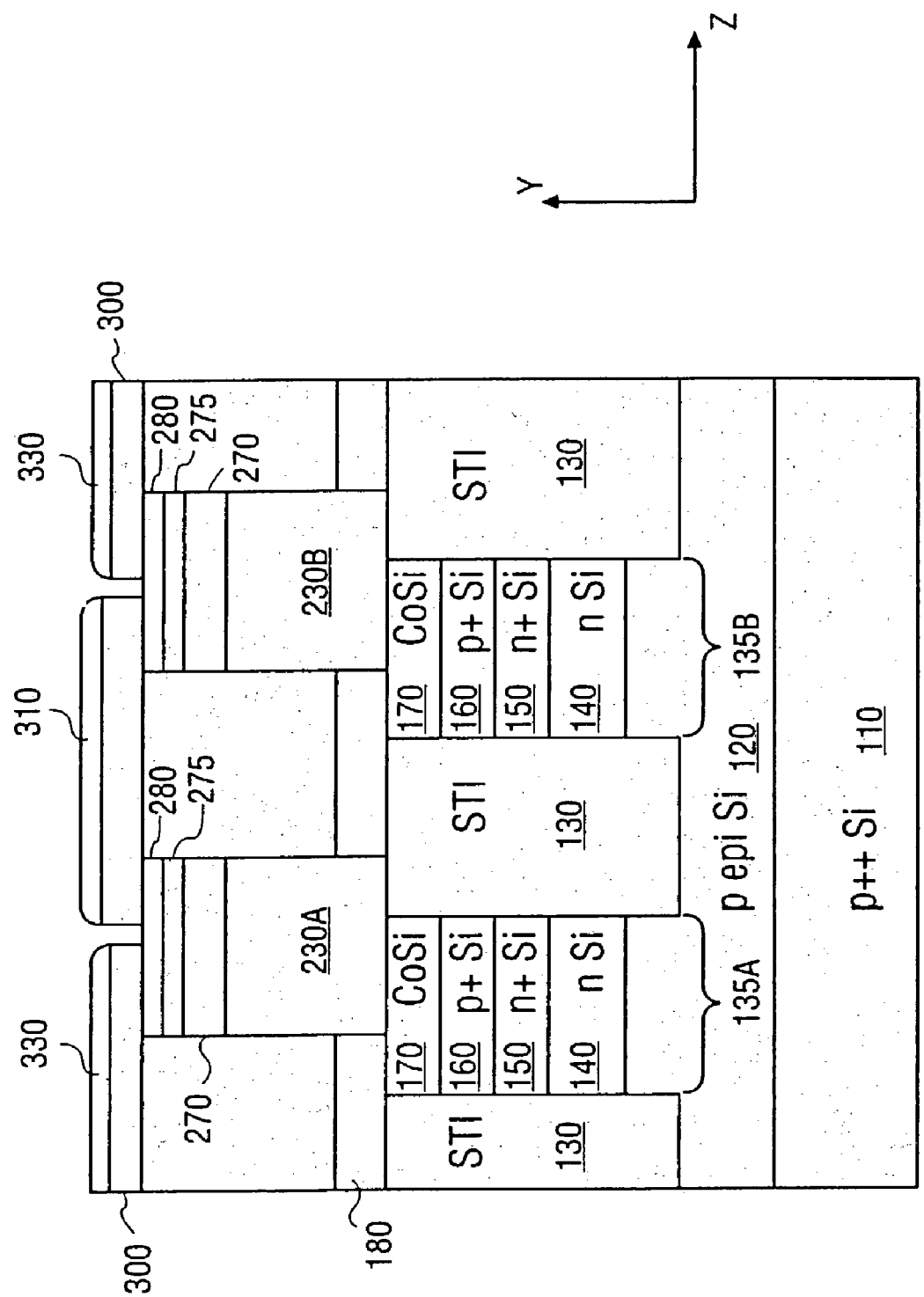
FIG. 15 shows the structure of FIG. 14 following a blanket etch to expose of a portion of the electrode material.

FIG. 15 shows the structure of FIG. 14 following the removal of first dielectric layer 300 to expose electrode material. The majority of the surface (the contact area) of the electrode material is covered by first dielectric layer 300 (and second dielectric layer 310 or third dielectric layer 330). The exposed portion of the contact area, in this example, is on the order of about 300-500 Å, equivalent to the thickness of the y-direction portions of spacer material 320 (see FIG. 10 and the accompanying text).

Referring to FIG. 15, first dielectric layer 300 of an oxide may be removed to expose the electrode material by an oxide etch (e.g., a dry oxide etch with a $CF_4/H_2$ or $CHF_3/H_2$ chemistry). In one embodiment, the etch is targeted to remove that portion of first dielectric layer 300 exposed with the removal of spacer layer 320, plus, particularly where third dielectric layer 330 is also an oxide (and susceptible to removal with the selected etch chemistry to remove first dielectric layer 300), an overetch to remove approximately 150 to 200 Å of third dielectric layer 330. Where second dielectric layer 320 is silicon nitride, the overetch may also remove portions of second dielectric layer 320. One target for the dielectric layers overlying electrode material given the layer/film thicknesses described above is approximately 275 to 675 Å of first dielectric layer 300/third dielectric layer 330 and 400 to 800 Å of first dielectric layer 300/second dielectric layer 310.

Figure 16:
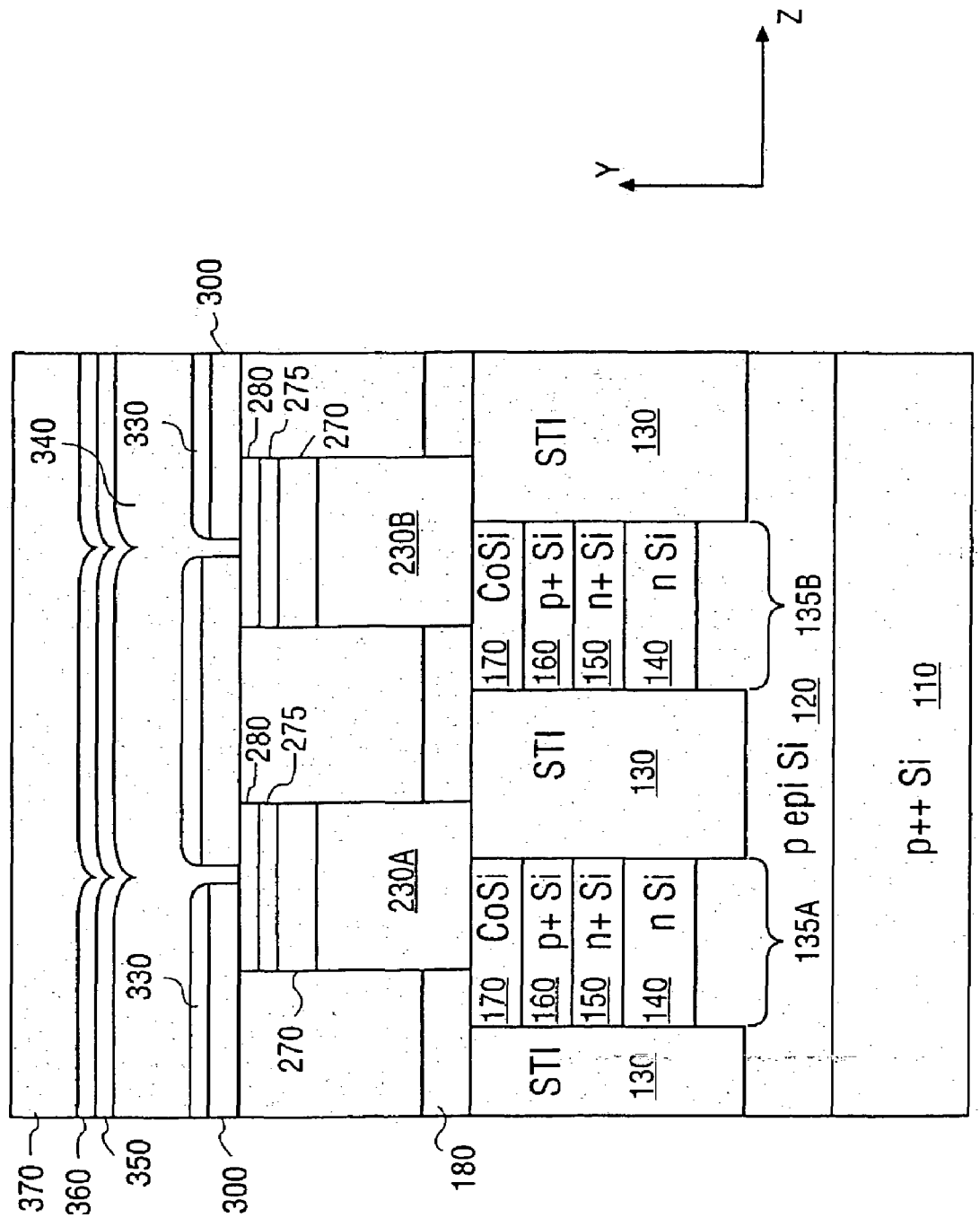
FIG. 16 shows the structure of FIG. 15 following the introduction of a phase change material and a second conductor or signal line.

FIG. 16 shows the structure of FIG. 15 following the introduction (deposition) of a layer of programmable material 340. In one example, programmable material 340 is a phase change material. In a more specific example, programmable material 340 includes a chalcogenide element(s). Examples of phase change programmable material 340 include, but are not limited to, compositions of the class of tellerium-germanium-antimony ($Te_xGe_ySb_z$) material. Programmable material 340, in one example according to current technology, is introduced to a thickness on the order of about 600 Å.

Overlying programmable material 340 in the structure of FIG. 16 are barrier materials 350 and 360 of, for example, titanium (Ti) and titanium nitride (TiN), respectively. Overlying barrier materials 350 and 360 is second conductor or signal line material 370. Barrier material serves, in one aspect, to inhibit diffusion between the volume of programmable material 340 and second conductor or signal line material 370 overlying the volume of programmable material 340. In this example, second conductor or signal line material 370 serves as an address line, a column line (e.g., column line 10 of FIG. 1). Second conductor or signal line material 370 is, for example, an aluminum material, such as an aluminum alloy. As shown in FIG. 16, second conductor or signal line material 370 is patterned to be, in one embodiment, generally orthogonal to first conductor or signal line 140.

Figure 17:
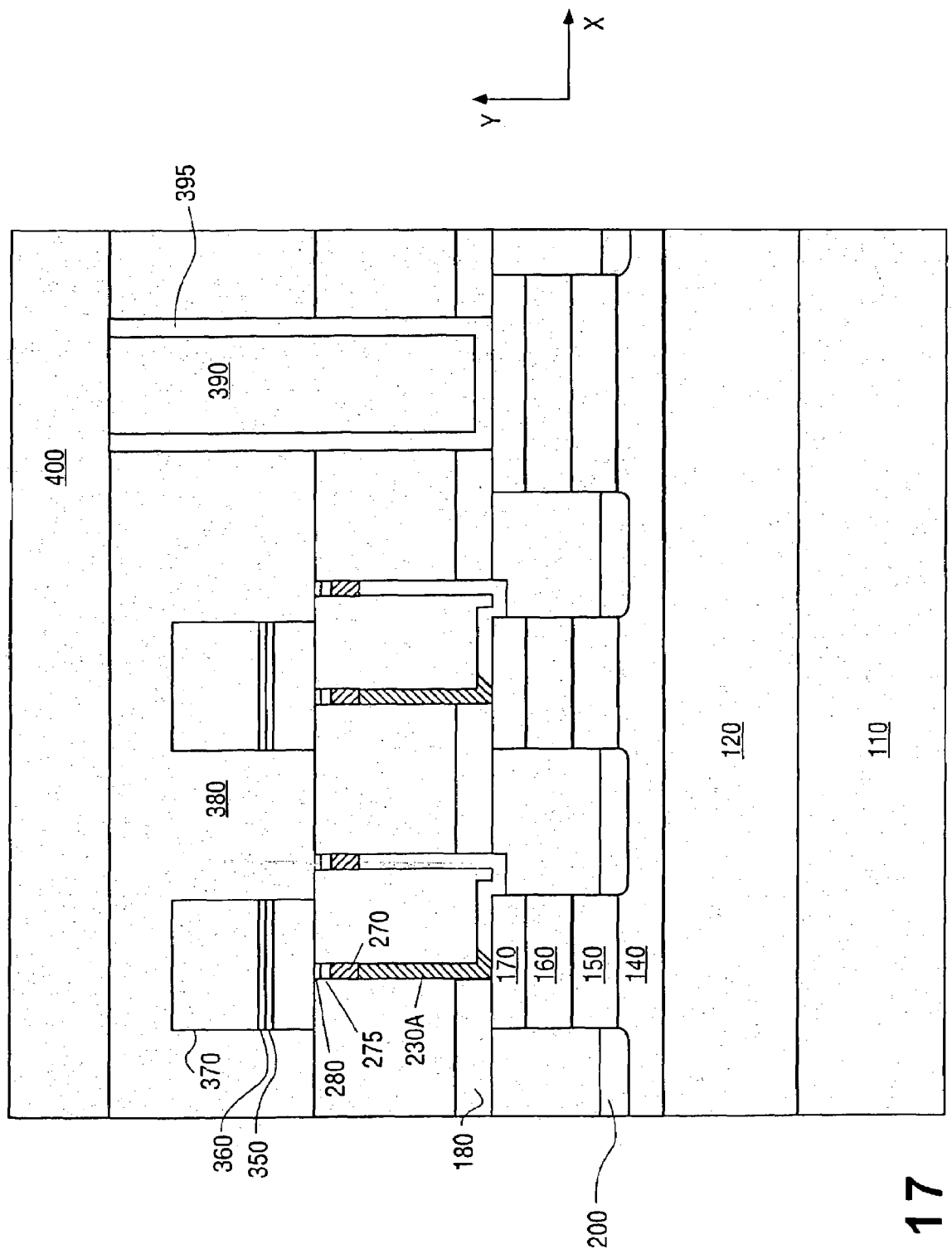
FIG. 17 shows the structure of FIG. 16 following the introduction of a mirror signal line over the structure.

FIG. 17 is an xy-direction cross-section of the structure shown in FIG. 16. It is to be appreciated at this point that programmable material 340 may be patterned contiguously with second conductor or signal line material 370 such that programmable material 340 is itself strips (like second conductor or signal line material 370) or is in a cellular form (achieved by patterning prior to patterning second conductor or signal line material 370).

FIG. 17 also shows the structure of FIG. 16 after the introduction of dielectric material 380 over second conductor or signal line material 370. Dielectric material 380 is, for example, $SiO_2$ or other suitable material that surrounds second conductor or signal line material 370 and programmable material 340 to electronically isolate such structure. Following introduction, dielectric material 380 is planarized and a via is formed in a portion of the structure through dielectric material 380, dielectric material 210, and masking material 180 to reducer material 170. The via is filled with conductive material 390 such as tungsten (W) and barrier material 395 such as a combination of titanium (Ti) and titanium nitride (TiN).

The structure shown in FIG. 17 also shows additional conductor or signal line material 400 introduced and patterned to mirror that of first conductor or signal line material 140 (e.g., row line) formed on substrate 100. Mirror conductor line material 400 mirrors first conductor or signal line material 140 and is coupled to first conductor or signal line material 140 through a conductive via. By mirroring a doped semiconductor such as N-type silicon, mirror conductor line material 400 serves, in one aspect, to reduce the resistance of conductor or signal line material 140 in a memory array, such as memory array 5 illustrated in FIG. 1. A suitable material for mirror conductor line material 320 includes an aluminum material, such as an aluminum alloy.

In memory element 15 of FIG. 1 and an embodiment fabricated in accordance with techniques described in FIGS. 2-17, the electrode delivers electrical current to the programmable material. As the electrical current passes through the electrode and through the programmable material, at least a portion of the electric potential energy of the electrons is transferred to the surrounding material as heat. That is, the electrical energy is converted to heat energy via Joule heating. While not wishing to be bound by theory, it is believed that dissipating power in the electrical contact from Joule heating adjacent to the programmable material may at least partially assist (or may even dominate) the programming of the programmable material. With phase change materials such as chalcogenide materials, a very small volume of material may be phase-changed (e.g., from crystalline to amorphous or vice versa) and dramatically affect the resistance from the one electrode (e.g., signal line through the programmable material to a second electrode (e.g., signal line). Hence, providing a reduced contact area adjacent to the programmable material reduces the volume of programmable material that is modified and may thus decrease the total power and energy needed to program the device.

Figure 18:
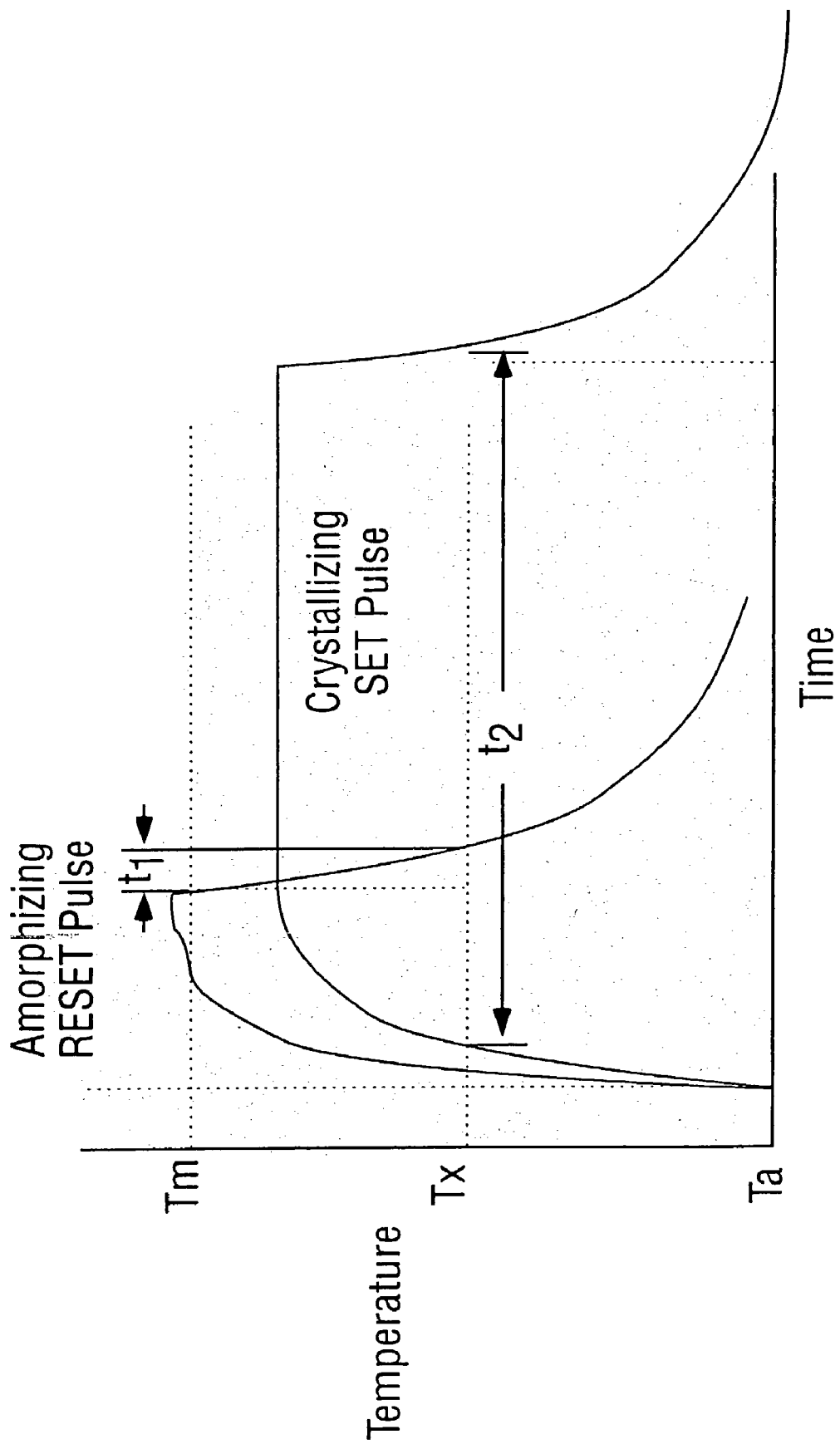
FIG. 18 shows a graphical representation of setting and resetting a volume of programmable material in terms of temperature and time.

FIG. 18 presents a graphical representation of the programming (e.g., setting and resetting) of a volume of programmable material that is a chalcogenide material. Referring to FIG. 1, programming memory element 15 (addressed by column line 10a and row line 20a) involves, in one example, supplying a voltage to column line 10a to introduce a current into the volume of programmable material 30. While not to be wishing bound by theory, the current causes a temperature increase at the volume of programmable material 30 due, it is believed, to Joule heating. Referring to FIG. 18, to amorphize a volume of programmable material, the volume of memory material is heated to a temperature beyond the amorphizing temperature, $T_M$ (e.g., beyond the melting point of the memory material). A representative amorphizing temperature for a $Te_xGe_ySb_z$ material is on the order of about 600-650° C. Once a temperature beyond $T_M$ is reached, the volume of memory material is quenched or cooled rapidly (by removing the current flow). The quenching is accomplished at a rate, $t_1$, that is faster than the rate at which the volume of programmable material 30 can crystallize so that the volume of programmable material 30 retains its amorphous state. To crystallize a volume of programmable material 30, the temperature is raised by current flow to the crystallization temperature for the material (representatively a temperature between the glass transition temperature of the material and the melting point) and retained at that temperature for a sufficient time to crystallize the material. After such time, the volume of programmable material is quenched (by removing the current flow).

In the preceding example, the volume of programmable material 30 was heated to a high temperature to amorphisize the material and reset the memory element (e.g., program 0). Heating the volume of programmable material to a lower crystallization temperature crystallizes the material and sets the memory element (e.g., program 1). It is to be appreciated that the association of reset and set with-amorphous and crystalline material, respectively, is a convention and that at least an opposite convention may be adopted. It is also to be appreciated from this example that the volume of memory material 30 need not be partially set or reset by varying the current flow and duration through the volume of memory material.

In the foregoing specification, the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. A method, comprising:
   forming a spacer over an electrode material;
   covering said spacer with a cover;
   removing the spacer to form an opening in said cover; and
   forming a memory material in the opening and contacting the electrode material.

2. The method of claim 1, forming a memory material in the opening includes forming a chalcogenide material in the opening and wherein forming a spacer includes forming polycrystalline silicon over the electrode material.

3. The method of claim 1, further comprising:
   forming a first dielectric material over the electrode;
   forming a second dielectric material over the electrode and the first dielectric; and
   patterning the second dielectric material into a body, a thickness of the body of the second dielectric material defining a side wall, wherein forming the spacer includes forming the spacer along the side wall and over the electrode material.

4. The method of claim 3, further comprising:
   forming a third dielectric material over the electrode, the spacer and the second dielectric material.

5. The method of claim 3, wherein removing the spacer to form an opening includes removing the spacer to form an opening to expose a portion of the first dielectric layer, wherein a diameter of the opening is substantially equal to the thickness of the spacer.

6. The method of claim 5, further comprising removing a portion of the first dielectric layer to expose an upper surface of the electrode through the opening.

7. The method of claim 3, wherein the first dielectric material has a different etch characteristic than second dielectric layer and wherein the second dielectric material has a different etch characteristic than the spacer.

8. The method of claim 1, wherein forming a spacer includes forming a spacer having a thickness of less than about 500 Å.

9. The method of claim 1, further comprising forming a first dielectric material having an edge portion over the electrode, wherein forming the spacer includes forming the spacer along the edge of the first dielectric material.

10. The method of claim 1, further comprising:
    forming a first address line coupled to the memory material via the electrode; and
    forming a second address line coupled to the memory material, wherein the second address line is substantially orthogonal to the first address line.

11. The method of claim 10, wherein the first address line is N-type doped silicon and the second address line includes aluminum.

12. The method of claim 10, further comprising:
    forming a first barrier material between the memory material and the second address line; and
    forming a second barrier material between the first barrier material and the second address line.

13. The method of claim 12, wherein the first barrier material is titanium (Ti) and the second barrier material is titanium nitride (TiN).

14. The method of claim 10, further comprising forming an isolation device coupled between the electrode and the first address line.

15. A method, comprising:
    forming a memory material; and
    forming an electrode in electrical communication with the memory material, wherein a contact area between the electrode and the memory material is less than a surface area of an upper surface of the electrode, wherein forming an electrode includes:
      forming a first dielectric material having a side wall over the electrode;
      forming a spacer over the electrode adjacent to the side wall and over the electrode, wherein the spacer has a different etch characteristic than the first dielectric material;
      removing the spacer to form an opening, wherein a diameter of the opening is substantially equal to a thickness of the spacer;
      forming a second dielectric material over the electrode, the spacer and the first dielectric material, wherein a portion of the opening is defined by the first dielectric material and the second dielectric material; and
      forming the memory material in the opening and contacting the electrode material, wherein the size of the contact area is substantially equal to the thickness of the spacer.

16. The method of claim 15, wherein forming a memory material includes forming a phase change material.

17. The method of claim 15, wherein forming a spacer includes forming a polycrystalline silicon layer over the electrode.

18. The method of claim 15, wherein forming a spacer includes forming a spacer having thickness of less than about 500 Å.

19. The method of claim 15, wherein forming the electrode includes:
    forming a first barrier material; and
    forming a second barrier material over the first barrier material, wherein an upper surface of the second barrier material forms the upper surface of the electrode.

20. The method of claim 19, wherein the first barrier material is titanium silicide ($TiSi_2$) and the second barrier material is titanium nitride (TiN).

21. The method of claim 15, further comprising:
    forming a first address line coupled to the memory material via the electrode; and
    forming a second address line coupled to the memory material, wherein the second address line is substantially orthogonal to the first address line.

22. The method of claim 21, wherein the first address line is N-type doped silicon and the second address line includes aluminum.

23. The method of claim 21, further comprising:
    forming a first barrier material between the memory material and the second address line; and
    forming a second barrier material between the first barrier material and the second address line.

24. The method of claim 23, wherein the first barrier material is titanium (Ti) and the second barrier material is titanium nitride (TiN).

25. The method of claim 21, further comprising forming an isolation device coupled between the electrode and the first address line.

* * * * *